United States Patent [19]

Maeda et al.

[11] Patent Number: 5,004,704
[45] Date of Patent: Apr. 2, 1991

[54] METHOD FOR MANUFACTURING A SEMICONDUCTOR DEVICE HAVING A PHOSPHO SILICATE GLASS LAYER AS AN INTERLAYER INSULATING LAYER

[75] Inventors: Satoshi Maeda, Ooita; Shizuo Sawada, Kanagawa, both of Japan

[73] Assignee: Kabushiki Kaisha Toshiba, Kanagawa, Japan

[21] Appl. No.: 428,903

[22] Filed: Oct. 30, 1989

[30] Foreign Application Priority Data

Nov. 28, 1988 [JP] Japan ............................. 63-298223

[51] Int. Cl.$^5$ .......................................... H01L 21/441
[52] U.S. Cl. .................................... 437/195; 437/978;
437/240; 437/228; 437/982; 148/DIG. 133
[58] Field of Search ............... 437/195, 978, 240, 228,
437/982; 148/DIG. 133

[56] References Cited

U.S. PATENT DOCUMENTS

| | | | |
|---|---|---|---|
| 4,349,584 | 9/1982 | Flatley et al. | 437/947 |
| 4,743,564 | 5/1988 | Sato et al. | 437/982 |
| 4,782,037 | 11/1988 | Tomozawa et al. | 437/240 |
| 4,824,767 | 4/1989 | Chambers et al. | 437/229 |
| 4,879,253 | 11/1989 | Wakamatsu | 148/DIG. 133 |

FOREIGN PATENT DOCUMENTS

| | | | |
|---|---|---|---|
| 0279125 | 12/1986 | Japan | 437/240 |
| 0018040 | 1/1987 | Japan | 437/982 |

OTHER PUBLICATIONS

"Barrier for Preventing Titanium Silicide Oxidation During Glass Reflow" IBM Tech. Disclosure Bulletin; vol. 31; 11/88.
VLSI Technology, Edited by S. M. Sze, Bell Laboratories, Inc., McGraw-Hill Book Company, pp. 112–129, 1983.

Primary Examiner—Brian E. Hearn
Assistant Examiner—Trung Dang
Attorney, Agent, or Firm—Finnegan, Henderson, Farabow, Garrett, and Dunner

[57] ABSTRACT

A Phospho Silicate Glass layer is used for an insulation layer between a lower wiring layer including a refractory metal silicide and an upper wiring layer in a semiconductor device of a multilevel interconnection structure. A reflow treatment is performed on the Phospho Silicate Glass layer using steam. A part of the lower wiring layer is oxidized during the reflow treatment, and the resistivity of the lower wiring layer is simultaneously lowered during the reflow treatment.

12 Claims, 7 Drawing Sheets

METHOD FOR MANUFACTURING A SEMICONDUCTOR DEVICE HAVING A PHOSPHO SILICATE GLASS LAYER AS AN INTERLAYER INSULATING LAYER

BACKGROUND OF THE INVENTION

1. Field of the Invention

This invention concerns a method for manufacturing a semiconductor device having a multilevel interconnection structure.

2. Description of the Prior Art

Conventionally, a Boron-doped Phospho Silicate Glass layer is used as an insulating layer between a lower wiring layer and an upper wiring layer. Since the Boron-doped Phospho Silicate Glass layer (BPSG) layer is easily smoothened by a heat treatment, it is preferable to use the BPSG layer as an interlayer between the lower and the upper wiring layers for preventing a formation of concave depression which sometimes causes a break in the upper wiring layer.

FIGS. 1A to 1F are cross sectional views illustrating a conventional method for manufacturing a semiconductor device having a PSG layer as an insulating layer between a lower wiring layer and an upper wiring layer.

At first, as shown in FIG. 1A, a semiconductor substrate 10 having a main surface is prepared. Then insulating layer 11 is formed on the semiconductor substrate 10. Next, a polysilicon layer and a refractory metal silicide layer, such as molybdenum silicide, are deposited successively on the insulating layer 11, and are selectively removed to form lower wiring layers made of the polysilicon layer 12 and the refractory metal silicide layer 13.

Then, as shown in FIG. 1B, an oxidizing treatment is performed to form an oxide layer 14 at the exposed portion of the polysilicon layer and the refractory silicide layer 13 so as to control the resistivity of the lower wiring layer. Then, a silicon oxide layer 15 is deposited by a Chemical Vapor Deposition (CVD) as an insulation layer or a passivation layer.

Next, as shown in FIG. 1C, a Boron-doped Phospho Silicate Glass layer (BPSG) 16 and a Phospho Silicate Glass layer (PSG) 17 are deposited successively. In the following description, the term "Phospho Silicate Glass" is used as a generic term which includes both the PSG and the BPSG, and the PSG and the BPSG are distinguished each other, for convenience.

Then, as shown in FIG. 1D, a heating treatment is performed in an ambient environment to which a Phosphorus, in the form of $POCl_3$ has been added, so as to smoothen the BPSG layer 16 and the PSG layer 17. This process is called reflow process.

Then, the PSG layer 17 is removed using, e.g., an ammonium fluoride ($NH_4F$) etchant. (FIG. 1E)

Next, an upper wiring layer 20 of, e.g., aluminum (Al), is deposited. (FIG. 1F)

In the conventional process if the step coverage of the BPSG layer 16 is poor, a space or a void 18 is sometimes formed and remains even though the reflow process of the BPSG layer has been carried out, as shown in FIG. 1C and FIG. 1D. Due to the high density of components required in large scale integration, the pitch between the adjacent lower wiring layers becomes narrow. Thus, the step coverage of the BPSG layer can become unsatisfactory. Furthermore, when the PSG layer 17 is removed, a hole 19 is sometimes formed due to an invasion of etchant into the void 18, as shown in FIG. 1E. Thus, the upper wiring layer 20 becomes thin at the step portion, and the upper wiring layer 20 is sometimes broken.

If the etching at the hole 19 progresses to a large extent, the insulating layers 15 and 14 may also become etched. Thus, a short circuit between the upper wiring layer 20 and the lower wiring layer 12, 13 is sometimes formed.

Furthermore, in the conventional process, the oxidation process of the lower wiring layer and the heat treatment for the reflow process are performed individually. Thus, there is a problem that the time required for the production process for the semiconductor device becomes excessively long.

Moreover, the refractory metal silicide layer is directly exposed to the oxidizing ambient. Thus, the amount of molybdenum (Mo) in the refractory metal silicide layer is significantly influenced by the change of the oxidation condition. Thus, the delicate control of the resistivity of the refractory metal silicide is difficult.

SUMMARY OF THE INVENTION

Therefore, an object of the present invention is to provide an improved method which can shorten the time required to manufacture a semiconductor device having an Phospho Silicate Glass layer as an insulation layer between a lower wiring and an upper wiring layer.

Another object of the present invention is to provide a method which prevents the formation of a void in the Phospho Silicate Glass layer.

To achieve the object, this invention provides a method for manufacturing a semiconductor device having a multilevel interconnection construction on a semiconductor substrate having a main surface, comprising the steps of: forming a first wiring layer on the main surface of the substrate; depositing an insulating layer covering the first wiring layer; depositing a first Phospho Silicate Glass layer on the insulating layer; heating the substrate in steam for smoothening the Phospho Silicate Glass layer; forming a second Phospho Silicate Glass layer on the smoothened first Phospho Silicate Glass layer; heating the semiconductor substrate in an ambient to which phoshorus has been added; removing the second Phosho Silicate Glass layer; and forming a second wiring layer on the smoothened first Phospho Silicate Glass layer.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. In the drawings:

FIGS. 2A to 2E are cross sectional views illustrating a first embodiment of the present invention;

DETAILED DESCRIPTION OF THE INVENTION

Referring now to the FIGS. 2A to 2E, a first embodiment of the present invention will be explained.

Figure 1A:
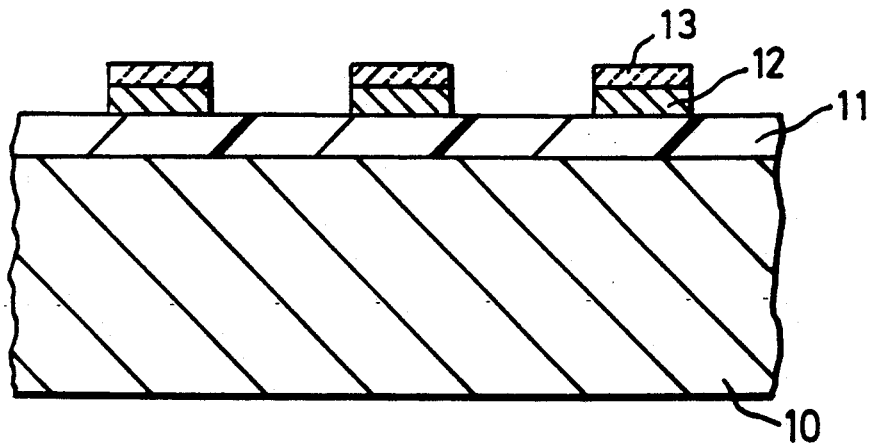
FIGS. 1A to 1F are cross sectional views illustrating a conventional process.
Figure 1B:
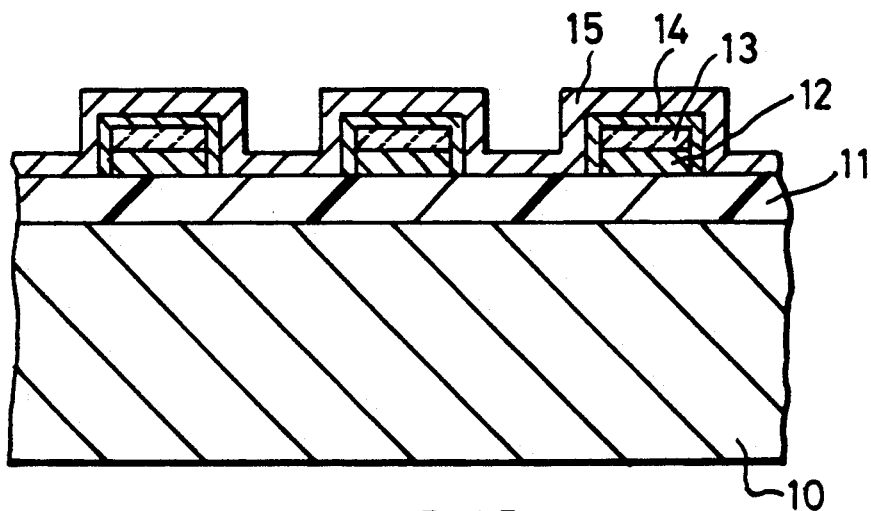
Figure 1C:
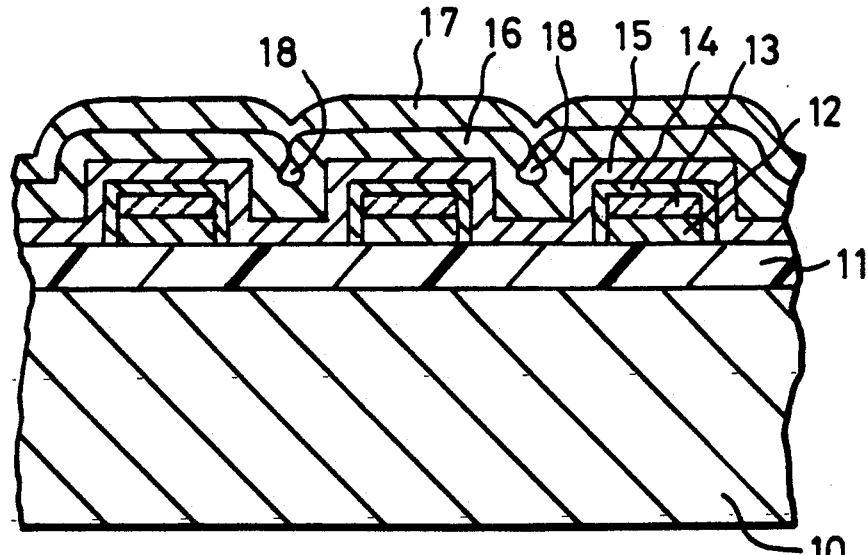
Figure 1D:
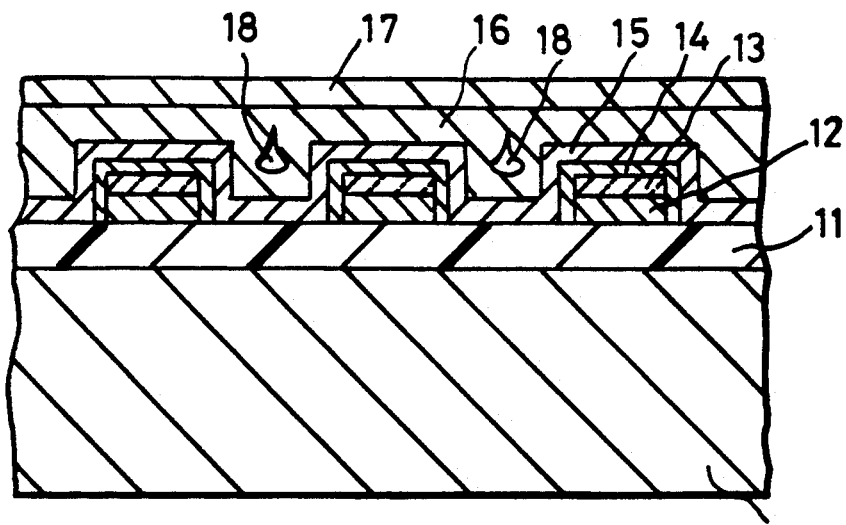
Figure 1E:
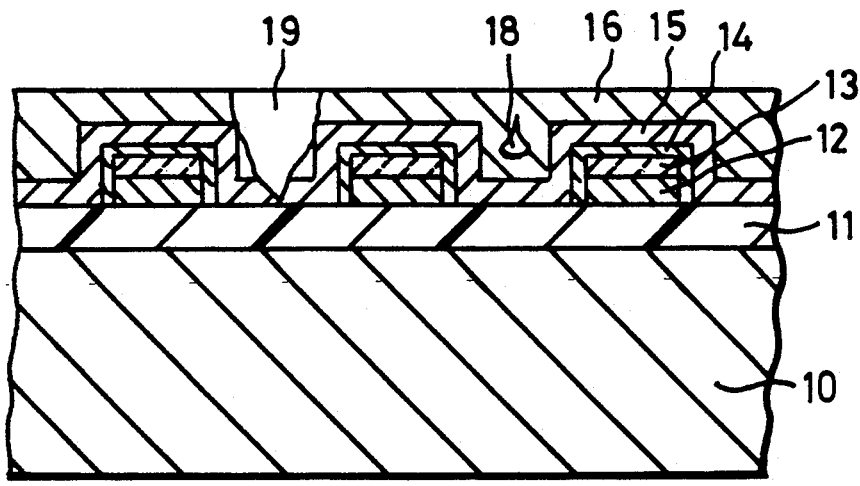
Figure 1F:
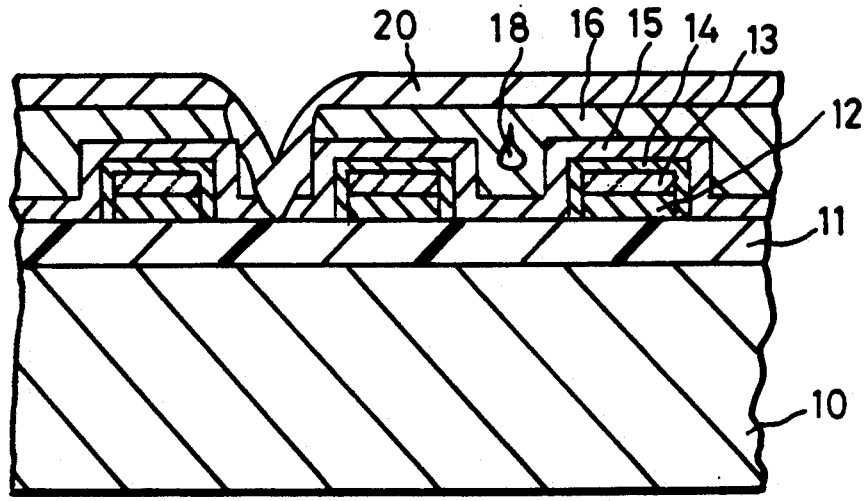

At first, as shown in FIG. 1A, a semiconductor substrate 30 having a main surface is prepared. Then an oxide layer 31 of about 5,000Å is formed on the main surface of the semiconductor substrate 30. Next, a polysilicon layer and a refractory metal silicide layer, e.g., a molybdenum silicide layer, are formed successively, and an etching step is carried out to selectively remove the polysilicon layer and molybdenum silicide layer to form a lower wiring layer of about 3,000Å made of the patterned polysilicon layer 32 and the refractory metal silicide layer 33.

Figure 2A:
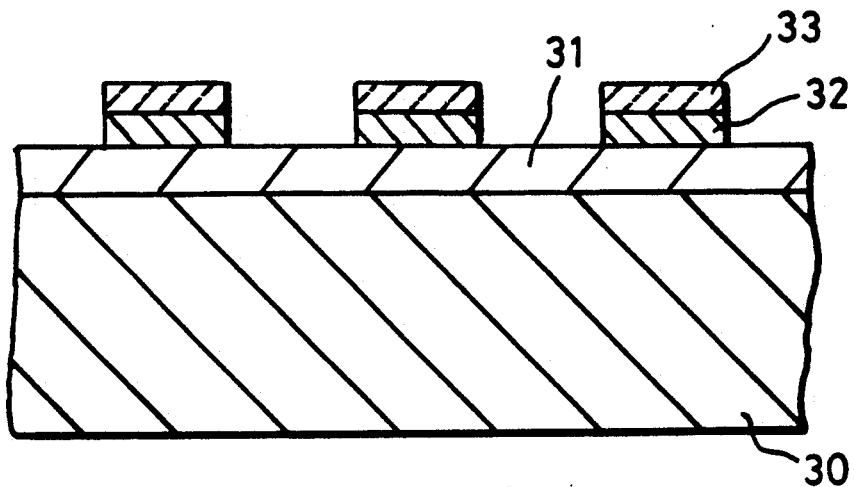
Figure 2B:
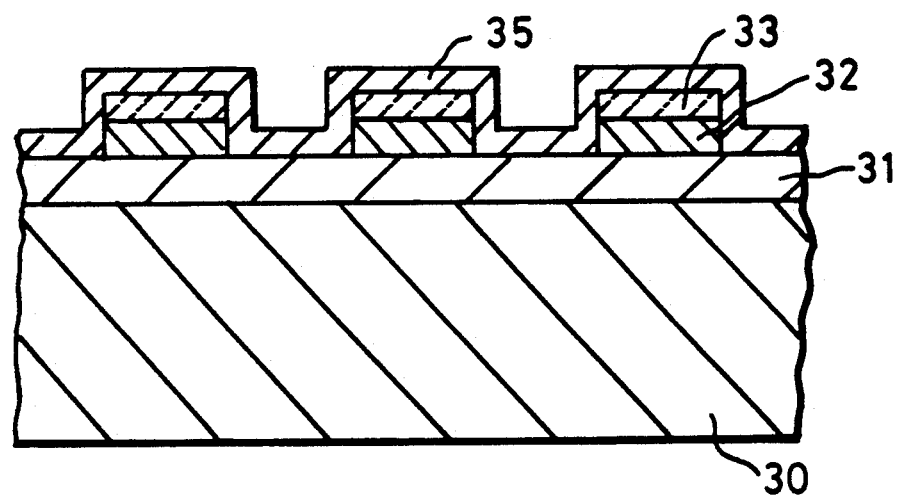

Next, an oxide layer 35 of about 1,000Å is formed by a CVD process. (FIG. 2B)

Figure 2C:
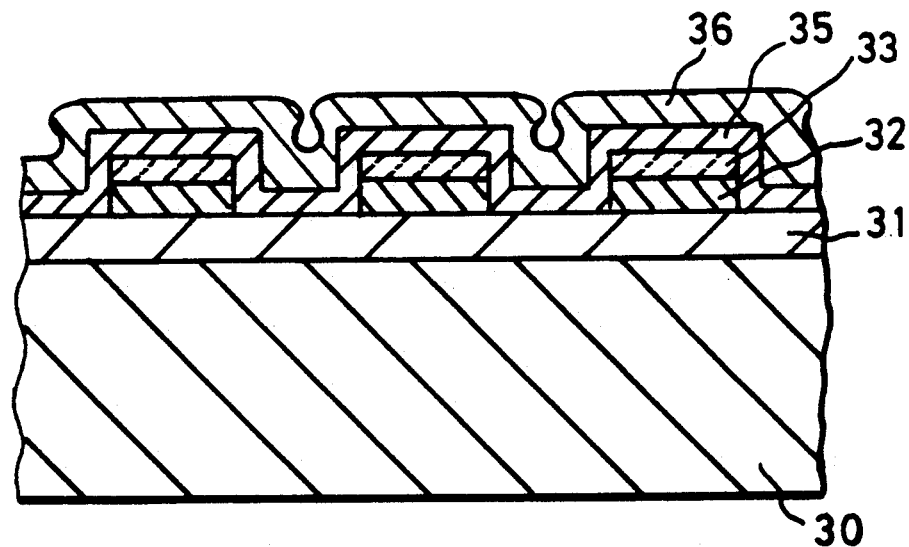

Then, a BPSG layer 36 of about 7,000Å is deposited. (FIG. 2C)

Next, as shown in FIG. 2D, a heat treatment in steam at, e.g. 900° C., is carried out for about 10 minutes to planarize or to smoothen the BPSG layer 36. In this step parts of the polysilicon layer 32 and the molybdenum silicide layer 33, where they make contact with the $SiO_2$ layer 35, is oxidized to form ar oxide layer 34 of about 200Å.

Then, an aluminum layer 37 is formed on the surface of the BPSG layer 36. (FIG. 2E)

In accordance with this embodiment, the molybdenum silicide layer 33 can be oxidized simultaneously during the heat treatment for the reflow process of the BPSG layer 36. Thus, a reduction of the number of the steps and a reduction of the processing time can be achieved Furthermore, since the heat treatment for the reflow is performed in steam, the reduction of processing time is significant. For example, in the conventional process using an ambient having $POCl_3$, about one hour is required for the heat treatment. On the other hand, in steam, this time can be reduced to about 10 minutes. Thus, the productivity can be significantly improved.

The content of the molybdenum per unit volume in the molybdenum silicide layer 33 is increased by the oxidation thereof. For example the molybdenum silicide is changed from $MoSi_{2.4}$ to $MoSi_{2.6}$. Therefore, the resistivity of the wiring can be lowered or controlled by the reflow process for the BPSG layer. The lower resistivity provides a higher operation speed of a semiconductor device formed on the semiconductor substrate.

In this embodiment, the oxidation of the molybdenum silicide layer 33 is performed after the BPSG layer 36 has been formed. Thus, the BPSG layer 36 acts as a buffer layer for the molybdenum silicide layer 33 during oxidation. Therefore, influence of steam heat treatment to the molybdenum silicide layer 33 can be reduced.

Figure 3A:
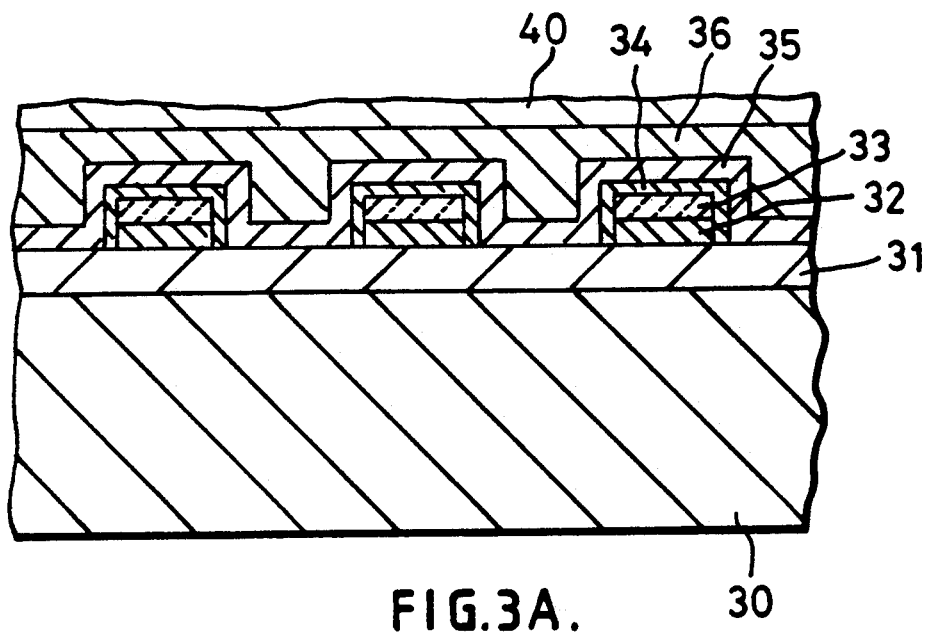
FIGS. 3A to 3B are cross sectional views illustrating a second embodiment of the present invention.
Figure 3B:
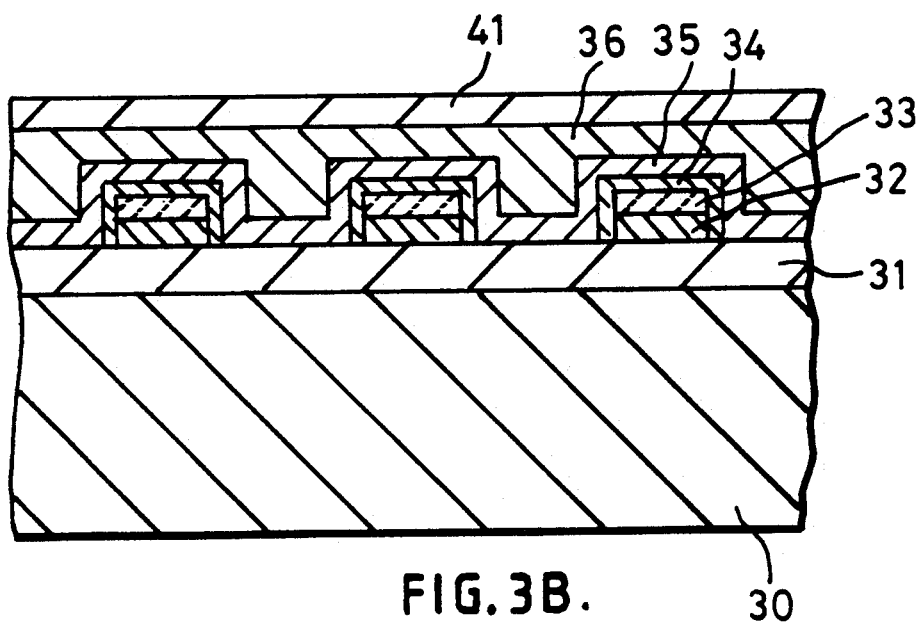

Next, a second embodiment according to the present invention will be explained referring FIGS. 3A to 3B. In the second embodiment, a PSG layer 40 shown in FIG. 3A is deposited on the BPSG layer 36 at the condition shown in FIG. 2D of the first embodiment.

Then, a heat treatment is carried out in an ambient to which $POCl_3$ has been added for removing harmful impurities, such as copper (Cu) and iron (Fe). Such impurities can act as recombination centers in the semiconductor substrate and promote the deterioration of the device. This process is called a "gettering" process.

Then, the PSG layer 40 is removed using, e.g., an $NH_4F$ etchant, and Al layer 41 is formed on the BPSG layer 36. (FIG. 3B)

In accordance with the second embodiment, the PSG layer 40 for the gettering process is formed after the reflow process of the BPSG layer 36 has been completed. Thus, the undesirable formation of voids in the BPSG layer 36 can be prevented. Therefore, an unfavorable formation of holes in the BPSG layer 36 at the removal of the PSG layer 40 can be prevented. Also, the life time of minority carriers can be made longer due to the gettering process.

Figure 4A:
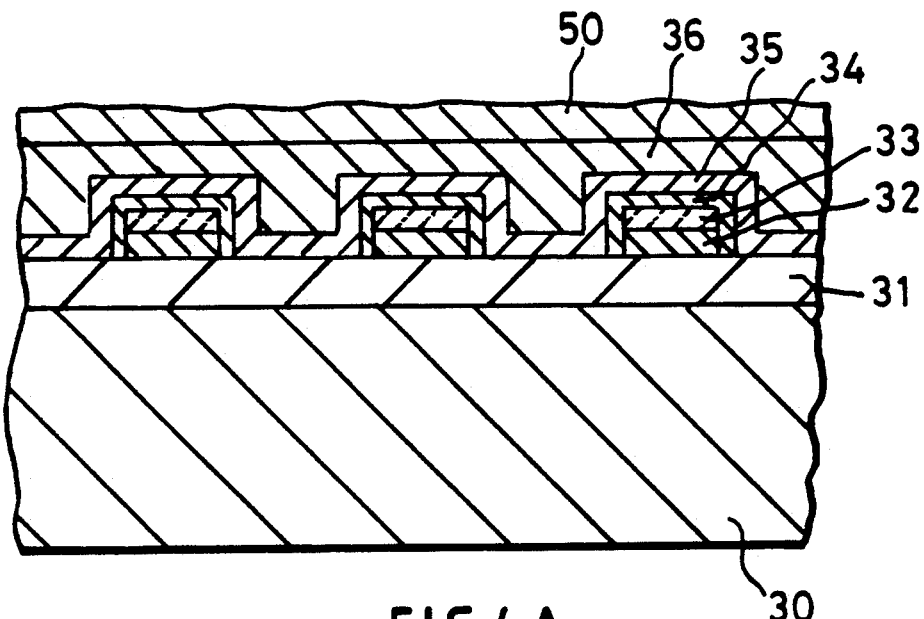
FIGS. 4A to 4B are cross sectional views illustrating a third embodiment of the present invention.
Figure 4B:
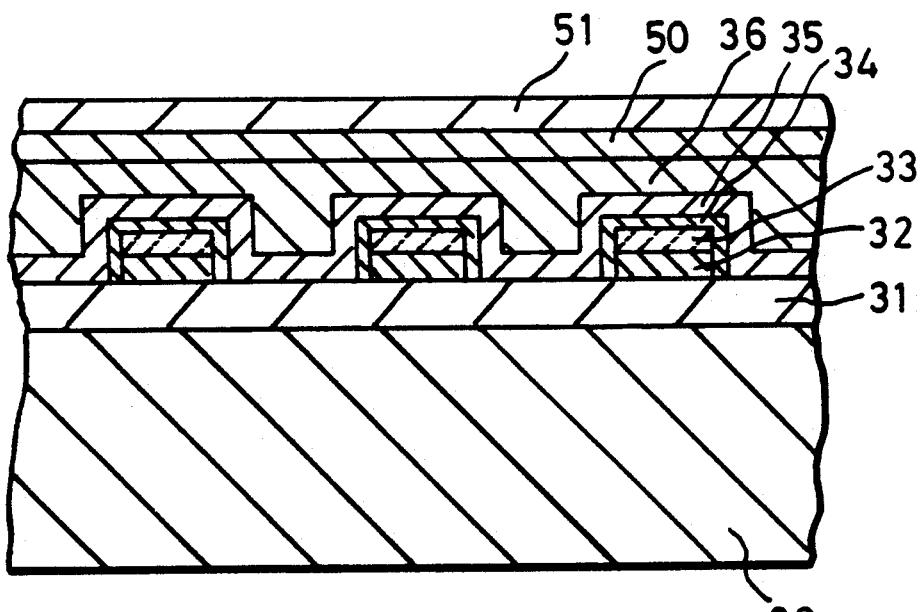

Next, a third embodiment according to the present invention will be explained referring FIGS. 4A to 4B. In the third embodiment, a second BPSG layer 50 is formed on the first BPSG layer 36 at the stage of the manufacturing process shown in FIG. 2D of the first embodiment. Then, a heat treatment is carried out in steam to smoothen the second BPSG layer 50.

Then, an Al layer 51 is formed on the second BPSG layer 50. (FIG. 4B)

In this third embodiment, the reflow process using a respective BPSG layer is performed twice. In other words two smoothened BPSG layers are utilized. Thus, the planarization can be improved.

Next, a fourth embodiment according to the present invention will be explained referring FIGS. 5A to 5C.

Figure 5A:
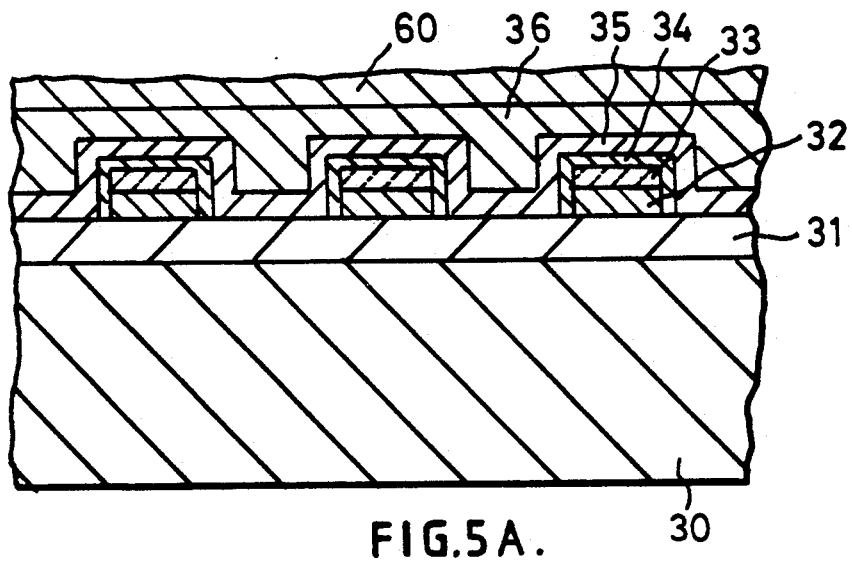
FIGS. 5A to 5C are cross sectional views illustrating a fourth embodiment of the present invention.

In this fourth embodiment, as shown in FIG. 5A, a second BPSG layer 60 is formed on the first BPSG layer 36 at the stage of the manufacturing process shown in FIG. 2D of the first embodiment. Then, a heat treatment in steam is carried out to smoothen the BPSG layer 60.

Figure 5B:
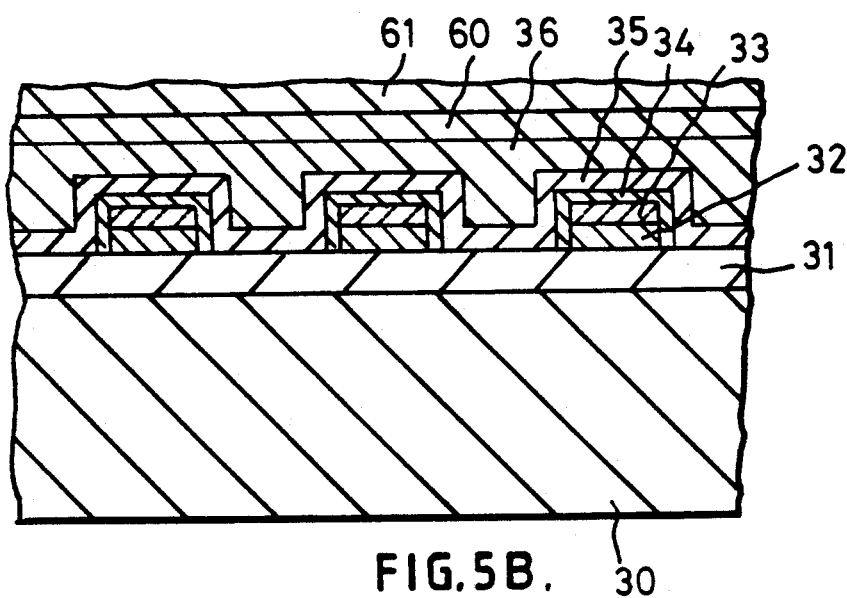
Figure 5C:
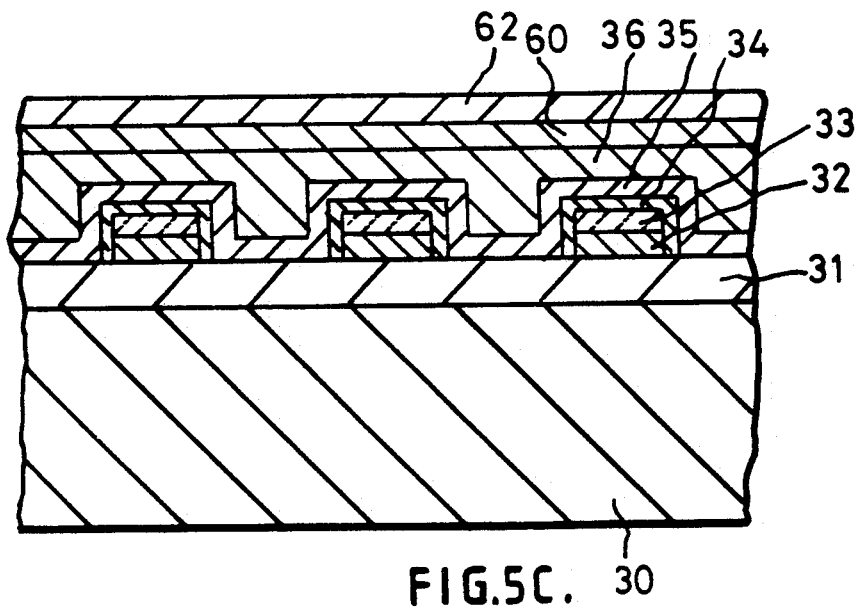

Then, as shown in FIG. 5B, a PSG layer 61 is formed on the BPSG layer 60. Next, a heat treatment in an ambient, to which $POCl_3$ has been added, is carried out.

Next, the PSG layer 61 is removed, and an Al layer 62 is formed on the BPSG layer 60. (FIG. 5C)

In this fourth embodiment, a reflow process using respective a BPSG layer is performed twice. Thus, the planarization can be improved. Furthermore, the PSG layer 61 for the gettering process is formed on the two smoothened BPSG layers 36 and 60. Therefore, the formation of voids in the BPSG layers 36 and 60 can be prevented, and the removal of the PSG layer 61 after the gettering process can be accomplished safety without forming holes in the underlying BPSG layers 36 and 60. Thus, a desired gettering of harmful impurities can be achieved, and the characteristic of the semiconductor device can be improved.

Next, a fifth embodiment according to the present invention will be explained referring FIGS. 6A to 6C.

Figure 6A:
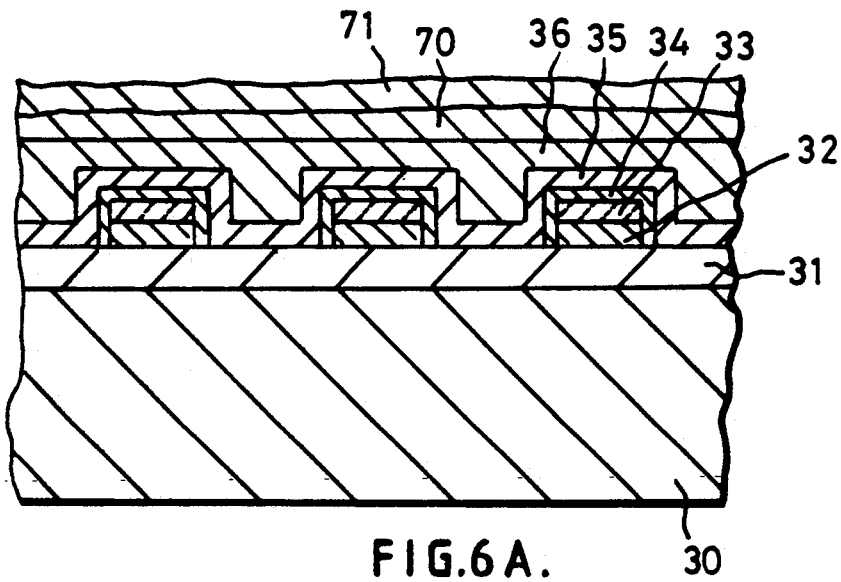
FIGS. 6A to 6C are cross sectional views illustrating a fifth embodiment of the present invention.
Figure 6B:
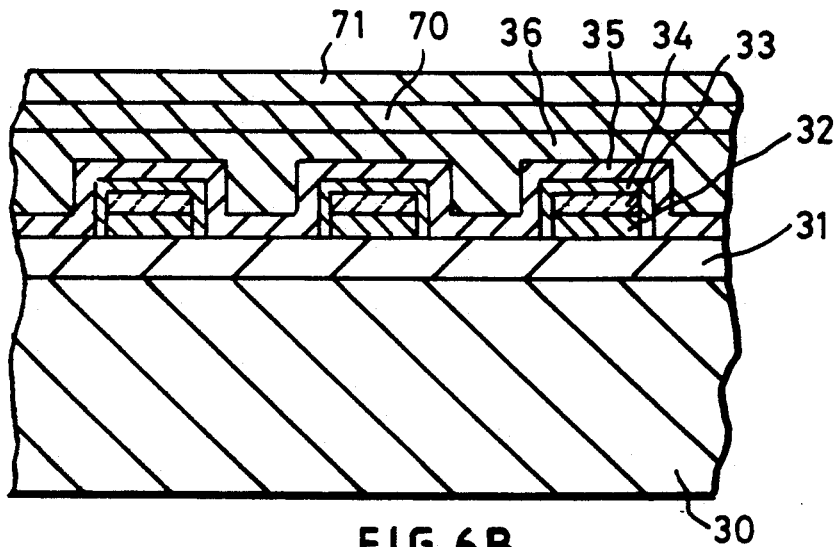
Figure 6C:
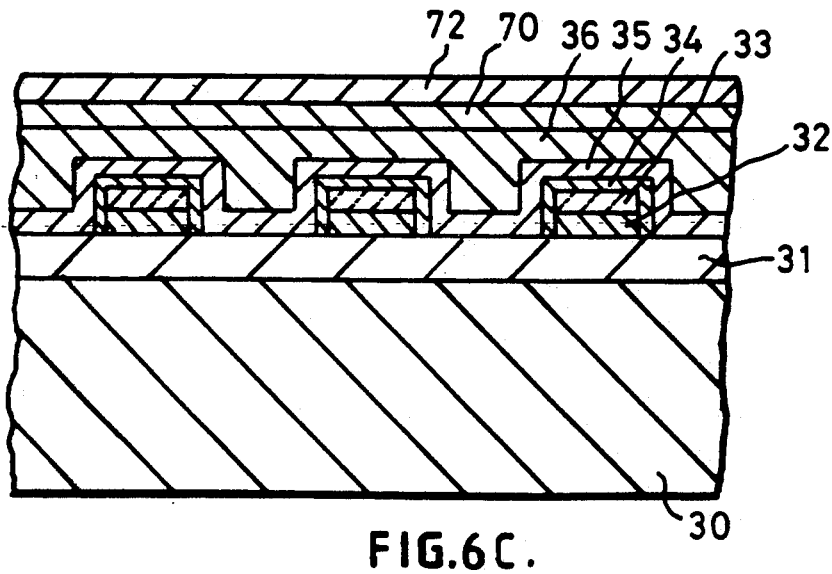

In this fifth embodiment as shown in FIG. 6A, a second BPSG layer 70 and a PSG layer 71 are formed successively on the first BPSG layer 36 at the stage of the manufacturing process shown in FIG. 2D of the first embodiment.

Then, a heat treatment in ambient, to which $POCl_3$ has been added, is carried out. (FIG. 6B)

Next the PSG layer 71 is removed, and an Al layer 72 is formed on the BPSG layer 70. (FIG. 6C)

In the fifth embodiment, a multi layer or a combination layer of the BPSG layer 70 and the PSG layer 71 is formed on the BPSG layer 36. By using the combination layer, the planarization and the gettering can be achieved during a subsequent heat treatment, simultaneously. Thus, a reduction of the processing time can be achieved.

In the aforementioned embodiments, molybdenum silicide is used as the refractory metal silicide layer. However, it is possible to use another refractory metal silicide layer, such as tungsten silicide and tantalum silicide.

Furthermore, in the aforementioned embodiments, a multi layer of a polysilicon layer and a refractory metal silicide layer is used as the lower wiring for making use of each characteristic of the low resistivity of the refractory silicide layer and the stability of the polysilicon layer. However, this invention can be applied to the semiconductor device wherein a single layer of a refractory metal silicide is utilized as a wiring layer.

Moreover, a silicon nitride layer ($Si_3N_4$) can be used in place of the insulating layer 35 which covers the lower wiring layer. In this case, the simultaneous oxidation of the refractory silicide layer during the reflow process of the BPSG layer cannot be achieved, since the $Si_3N_4$ layer an oxidation-resisting property.

The present invention has been described with respect to a specific embodiment. However, other embodiments based on the principles of the present invention should be obvious to those of ordinary skill in the art. Such embodiments are intended to be covered by the claims.

What is claimed is:

1. A method for forming a multilevel interconnection structure on a substrate having a main surface, comprising the steps of:
   forming a first wiring layer on the main surface of the substrate;
   forming an oxide layer on the first wiring layer;
   forming a first Boron-doped Phospho Silicate Glass (BPSG) layer on the oxide layer;
   heating the substrate in steam;
   forming a second Boron-doped Phospho Silicate Glass layer on the first BPSG layer;
   heating the substrate in steam; and
   forming a second wiring layer on the second BPSG layer.

2. The method according to claim 1, wherein the step of heating the substrate in steam includes heating the substrate to smoothen the first BPSG layer and oxidize the first wiring layer.

3. The method according to claim 1, wherein the step for preparing the first wiring layer includes:
   forming a polysilicon layer;
   forming a refractory metal silicate layer on the polysilicon layer; and
   selectively removing the polysilicon layer and the refractory metal silicide layer.

4. The method according to claim 1, further comprising the steps of:
   forming a Phospho Silicate Glass (PSG) layer on the second BPSG layer after the step of heating the substrate subsequent to the forming of the second BPSG layer; and
   subsequently heating the substrate in an ambient to which ambient phosphorus is added.

5. A method for manufacturing a semiconductor device having a multilevel interconnection construction on a semiconductor substrate having a main surface, comprising the steps of:
   forming a first wiring layer on the main surface of the substrate;
   depositing an insulating layer covering the first wiring layer;
   depositing a first Phospho Silicate Glass layer on the insulating layer;
   heating the substrate in steam for smoothening the first Phospho Silicate Glass layer;
   forming a second Phospho Silicate Glass layer on the smoothened first Phospho Silicate Glass layer;
   heating the semiconductor substrate in an ambient to which phosphorus has been added;
   removing the second Phospho Silicate Glass layer; and
   forming a second wiring layer on the smoothened first Phospho Silicate Glass layer.

6. The method according to claim 5, wherein the first Phospho Silicate Glass layer is doped with boron.

7. The method according to claim 6, wherein the first insulating layer is an oxide layer.

8. A method for manufacturing a semiconductor device having a multilevel interconnection construction on a semiconductor substrate having a main surface, comprising the steps of:
   forming a first wiring layer on the main surface of the substrate;
   depositing an oxide layer covering the first wiring layer;
   depositing a first BPSG layer on the insulating layer;
   heating the substrate in steam for smoothening the first BPSG layer;
   forming a second BPSG layer on the smoothened first BPSG layer;
   forming a PSG layer on the second BPSG layer;
   heating the semiconductor substrate in an ambient to which phosphorus has been added;
   removing the PSG layer; and
   forming a second wiring layer on the second BPSG layer.

9. A method for forming a multilevel interconnection structure on a substrate having a main surface, comprising the steps of:
   forming a first wiring layer on the main surface of the substrate;
   forming an oxide layer on the first wiring layer;
   forming a first Boron-doped Phospho Silicate Glass (BPSG) layer on the oxide layer;
   heating the substrate in steam; and
   forming a multi-layer made of a Boron-doped Phospho Silicate Glass (BPSG) layer and a Phospho Silicate Glass (PSG) layer, said method further comprising the steps of forming a second wiring layer on said multi-layer and heating the substrate in an ambient to which ambient phosphorus is added.

10. The method according to claim 9, further comprising the step of;
    removing the PSG layer after the step of heating the substrate in an ambient.

11. The method according to claim 9, wherein the step of heating the substrate in steam includes heating the substrate to smoothen the first BPSG layer and an oxidize the first wiring layer.

12. The method according to claim 9, wherein the step of preparing the first wiring layer includes:
    forming a polysilicon layer;
    forming a refractory metal silicate layer on the polysilicon layer; and
    selectively removing the polysilicon layer and the refractory metal silicide layer.

* * * * *